(12) United States Patent
Rinerson et al.

(10) Patent No.: US 7,009,235 B2
(45) Date of Patent: Mar. 7, 2006

(54) CONDUCTIVE MEMORY STACK WITH NON-UNIFORM WIDTH

(75) Inventors: Darrell Rinerson, Cupertino, CA (US); Steven W. Longcor, Mountain View, CA (US); Christophe J. Chevallier, Palo Alto, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 10/605,963

(22) Filed: Nov. 10, 2003

(65) Prior Publication Data
US 2005/0101086 A1 May 12, 2005

(51) Int. Cl.
*H01L 27/108* (2006.01)

(52) U.S. Cl. .................. 257/300; 438/257; 438/3

(58) Field of Classification Search ............. 257/296, 257/295
See application file for complete search history.

(56) References Cited

U.S. PATENT DOCUMENTS

| | | | | |
|---|---|---|---|---|
| 6,204,139 | B1 | 3/2001 | Liu et al. .................... | 438/385 |
| 6,249,014 | B1 * | 6/2001 | Bailey ........................ | 257/295 |
| 6,456,525 | B1 | 9/2002 | Perner et al. ............... | 365/171 |
| 6,603,161 | B1 * | 8/2003 | Kanaya et al. .............. | 257/295 |
| 6,680,499 | B1 * | 1/2004 | Kumura et al. ............. | 257/295 |
| 6,809,360 | B1 * | 10/2004 | Kato .......................... | 257/295 |

OTHER PUBLICATIONS

Beck, A. et al., "*Reproductible switching effect in thin oxide films for memory applications*," Applied Physics Letters, vol. 77, No. 1, Jul. 3, 2000,139-141.

Liu, S.Q., et al., "*Electric-pulse-induced reversible resistance change effect in magnetoresistive films*", Applied Physics Letters, vol. 76, No. 19, May 8, 2000, 2749-2651.

Liu, S.Q., et al., "*A New Concept For Non-Volatile Memory: Electric-Pulse Induced Reversible Resistance Change Effect In Magnetoresistive Films*", Space Vacuum Epitaxy Center, University of Huston, Huston Tx, 7 Pages.

Park, In Seon et al., "*Ultra-thin EBL (encapsulated barrier layer) for Ferroelectric Capacitor*," IDEM, vol. 97, 617-620.

Rossel, C. et al., "*Electrical current distribution across a metal-insulator-metal structure during bistable switching*," Journal of Applied Physics, vol. 90, No. 6, Sep. 15, 2001, 2892-2898.

Watanabe, Y. et al., "*Current-driven insulator-conductor transition and nonvolatile memory in chromium-doped $SrTiO_3$ single crystals*," Applied Physics Letters, vol. 78, No. 23, Jun. 4, 2001, 3738-3740.

Yoon, Dong-soon et al., "*High Performance of Novel Oxygen Diffusion Barrier Materials for Future High-Density Dynamic Random Access Memory Devices*," IEEE Transactions on Electron Devices, vol. 49, No. 11, Nov. 2002, 1917-1927.

* cited by examiner

*Primary Examiner*—Thao P. Le
(74) *Attorney, Agent, or Firm*—Trueman H. Denny, III

(57) ABSTRACT

A conductive memory stack is provided. The memory stack includes a bottom electrode, a top electrode and a multi-resistive state element that is sandwiched between the electrodes. The bottom electrode can be described as having a top face with a first surface area, the top electrode has a bottom face with a second surface area and the multi-resistive state element has a bottom face with a third surface area and a top face with a fourth surface area. The multi-resistive state element's bottom face is in contact with the bottom electrode's top face and the multi-resistive state element's top face is in contact with the top electrode's bottom face. Furthermore, the fourth surface area is not equal to the second surface area.

20 Claims, 12 Drawing Sheets

CONDUCTIVE MEMORY STACK WITH NON-UNIFORM WIDTH

BACKGROUND OF INVENTION

1. Field of the Invention

The present invention relates generally to computer memory, and more specifically to the structure and fabrication of memory elements in an integrated circuit.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be delivered through two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in the U.S. Pat. No. 6,204,139 patent are not generally applicable to RAM memory because the resistance of the material, when scaled to small dimensions, is considered to be too large to make a memory with fast access times.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and non-volatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercial memory product. There are continuing efforts to bring a true non-volatile RAM (nvRAM) to market.

SUMMARY OF INVENTION

In one embodiment the present invention provides a conductive memory device that can be used as a fundamental element in an integrated circuit. Each conductive memory device includes a conductive top and bottom electrode, and a multi-resistive state element. The multi-resistive state element is arranged on top of and in contact with the bottom electrode and the conductive top electrode is arranged on top and in contact with the multi-resistive state element. The conductive memory device is generally operable to be reversibly placed in multiple resistive states.

A diffusion barrier, typically made of $Si_3N_4$, $TiO_2$ or $Al_2O_3$, and also acting as an etch stop during manufacturing, can be provided to surround the side surfaces of the sandwich of bottom electrode, top electrode and memory material.

The top electrode cross section can be, to reduce the effect of a leakage current conduction through a damaged outer periphery of the memory material during manufacturing, optionally made smaller than both the bottom electrode and the memory material with the cross sectional difference possibly made up by a dielectric spacer surrounding the side of the top electrode. The spacer can be made of $Si_3N_4$, $SiO_2$, $TiO_2$, SiON or $Al_2O_3$. To ensure a corresponding manufacturability of the spacer, a hard mask layer can be provided atop the top electrode.

The memory material cross section can be, to remove a damaged outer periphery of the memory material during manufacturing, optionally made smaller than both the bottom electrode and the top electrode, thus defining an undercut profile.

To make an integrated circuit including these conductive memory devices, the major steps are typically providing a bottom front end of line (FEOL) section that is a partially processed wafer from a standard IC process, forming a middle memory plug section containing these conductive memory devices and forming a top metallization section.

To form a plurality of desired conductive plugs, each destined to connect the FEOL circuitry to a bottom electrode of a corresponding conductive memory device, into a first inter-layer dielectric atop the FEOL section the major steps are typically forming a plurality of contact holes through the first inter-layer dielectric, depositing a conductive plug material within the contact holes and removing excess conductive plug material atop the first inter-layer dielectric surface. As an improvement, a barrier/adhesion layer can be formed before depositing the conductive plug material.

To form the middle memory plug section the major steps are typically sputtering a bottom electrode layer, sputtering a memory material layer, sputtering a top electrode layer and photo lithographically patterning the top electrode, the memory material and the bottom electrode.

After photo lithographically patterning the top electrode, the memory material and the bottom electrode, an optional wet etching can be applied to remove a damaged outer periphery of the memory material during manufacturing, thus forming the undercut.

The process of forming the middle memory plug section can include an additional conductive hard mask layer atop the top electrode layer plus an anisotropically etchable dielectric spacer material atop the hard mask layer to form the dielectric spacer.

As an improvement, one or both of the bottom electrode and the top electrode can be made of a conductive layer and a barrier layer to prevent metal inter-diffusion.

The formation of the middle memory plug section can further include forming a second inter-layer dielectric atop an intervening etch stop/diffusion barrier.

The formation of the top metallization section can further include forming, together with a third inter-layer dielectric, one or more metallization layers with standard processes.

BRIEF DESCRIPTION OF DRAWINGS

The invention may best be understood by reference to the following description taken in conjunction with the accompanying drawings, in which.

It is to be understood that, in the drawings, like reference numerals designate like structural elements. Also, it is understood that the depictions in the FIGs are not necessarily to scale.

DETAILED DESCRIPTION

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized. Co-pending U.S. patent application, "Cross Point Memory Array Using Multiple Thin Films," U.S. application Ser. No. 10/330,512, filed Dec. 26, 2002, incorporated herein by reference in its entirety and for all purposes, describes such a device.

Figure 1A:
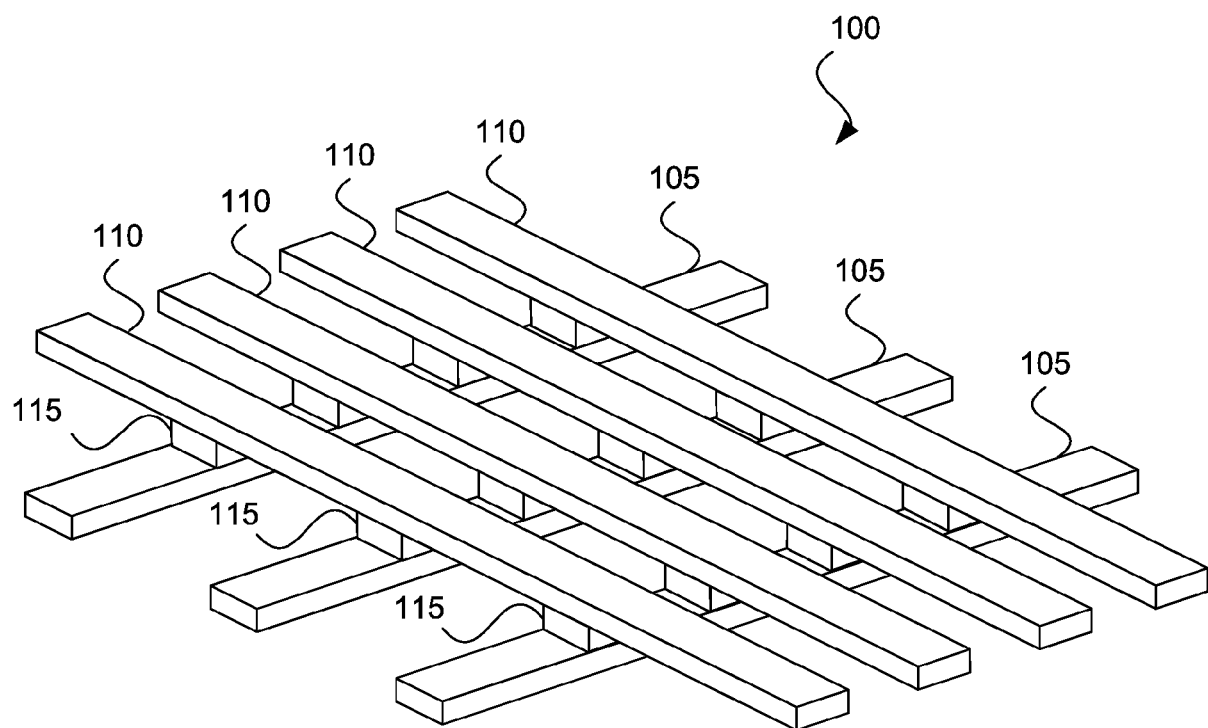
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2A:
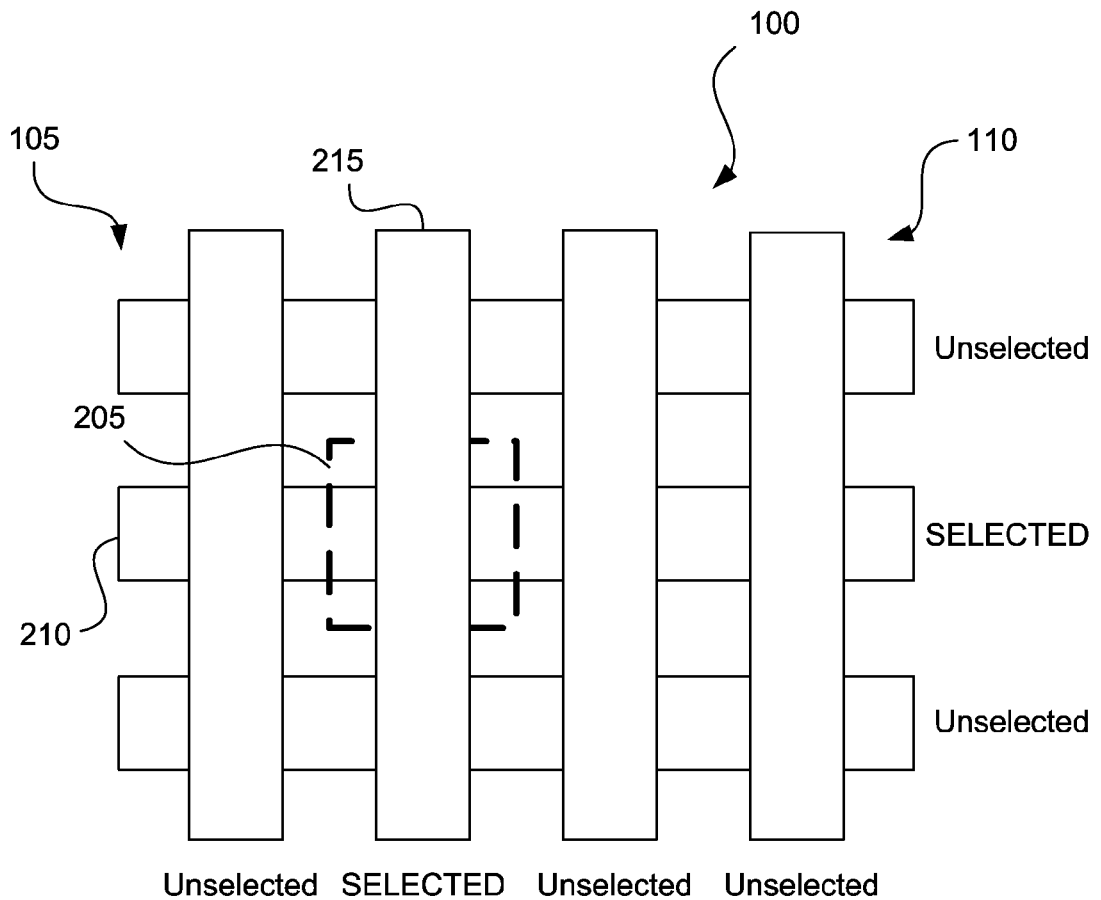
FIG. 2A depicts a plan view of selection of a memory cell in the cross point array depicted in FIG. 1A.
Figure 2B:
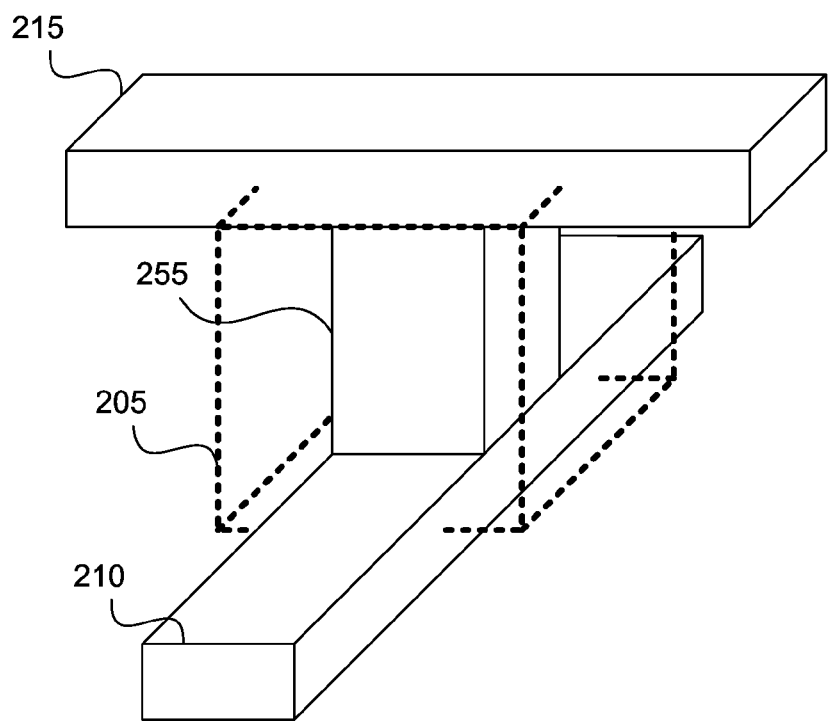
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 1B:
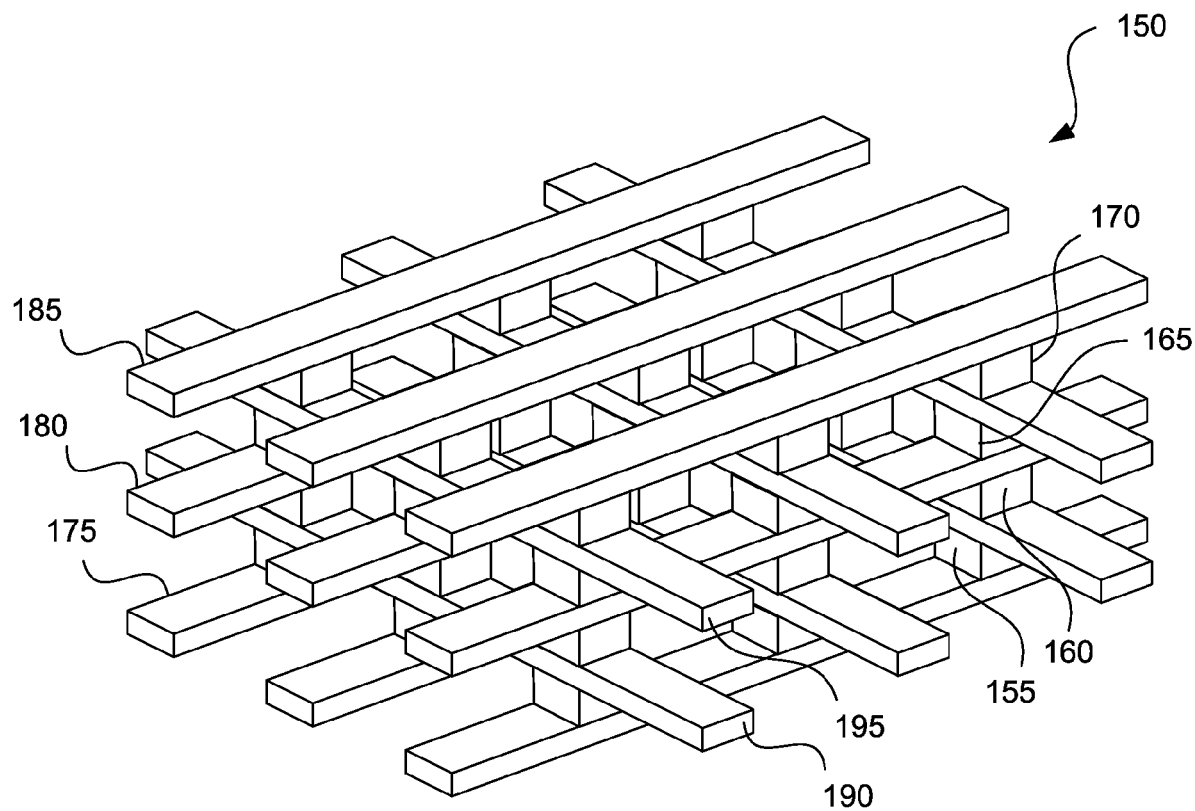
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170. Co-pending U.S. patent application, "Re-Writable Memory With Multiple Memory Layers," U.S. application Ser. No. 10/612,191, filed Jul. 1, 2003, incorporated herein by reference in its entirety for all purposes, describes stacked cross point arrays.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 100 or 150 can be placed beneath the cross point array, therefore reducing the footprint required on a semiconductor substrate. Co-pending U.S. patent application, "Layout Of Driver Sets In A Cross Point Memory Array," U.S. application Ser. No. 10/612,733, filed Jul. 1, 2003, incorporated herein by reference in its entirety for all purposes, describes various circuitry that can achieve a small footprint underneath both a single layer cross point array 100 and a stacked cross point array 150.

The cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
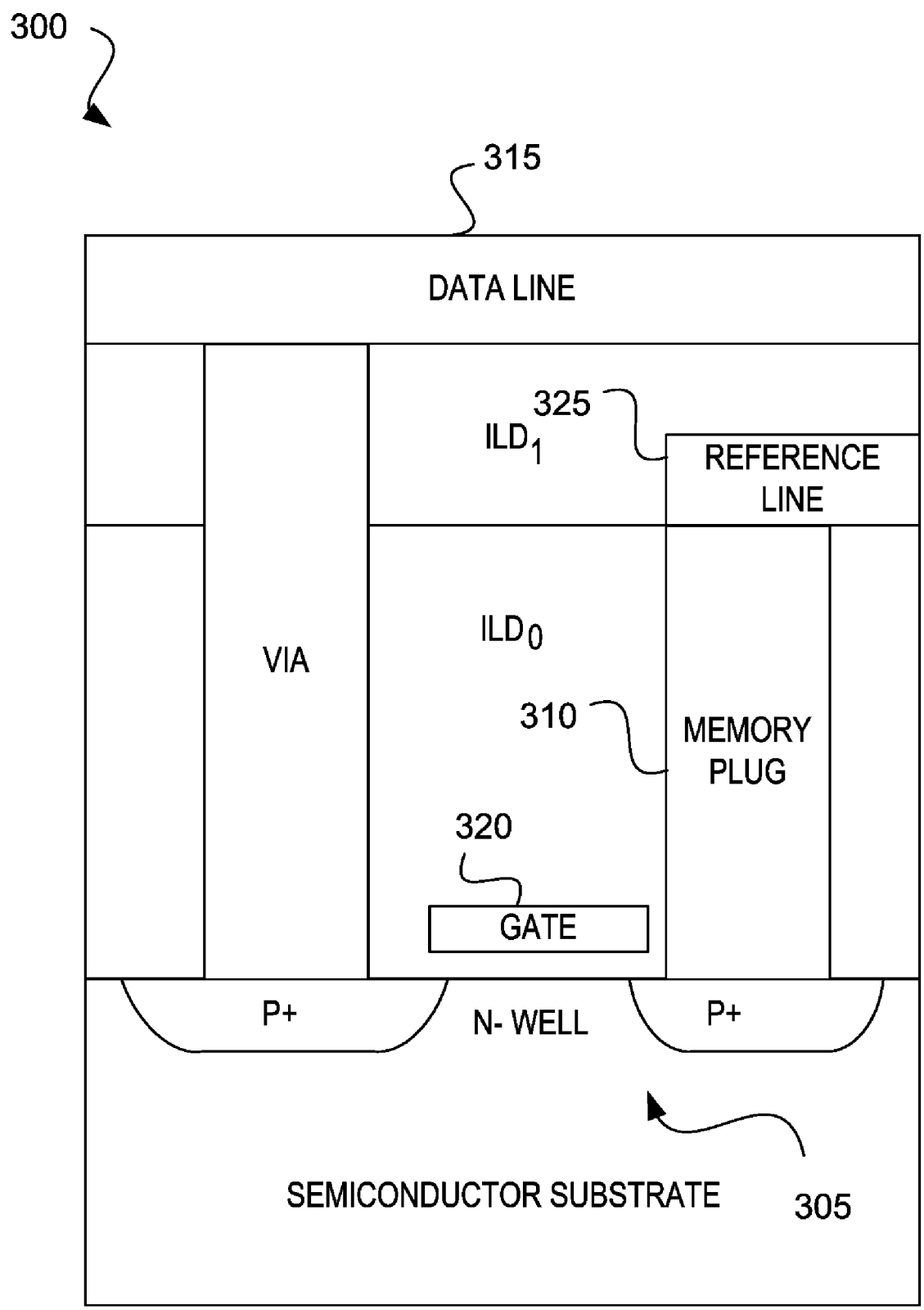
FIG. 3 depicts a is a generalized representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other. Co-pending U.S. patent application, "Non-Volatile Memory with a Single Transistor and Resistive Memory Element," U.S. application Ser. No. 10/249,848, filed May 12, 2003, incorporated herein by reference in its entirety for all purposes, describes the specific details of designing and fabricating a transistor memory array.

The Memory Plug

Each memory plug 255 or 310 contains a multi-resistive state element (described later) along with any other materials that may be desirable for fabrication or functionality. For example, the additional materials might include a non-ohmic device, as is described in co-pending application "High Density NVRAM," U.S. application Ser. No. 10/360,005, filed Feb. 7, 2003, incorporated herein by reference in its entirety for all purposes. The non-ohmic device exhibits a very high resistance regime for a certain range of voltages ($V_{NO-}$ to $V_{NO+}$) and a very low resistance regime for voltages above and below that range. The non-ohmic device, either alone or in combination with other elements, may cause the memory plug 255 or 310 to exhibit a non-linear resistive characteristic. Exemplary non-ohmic devices include three-film metal-insulator-metal (MIM) structures and back-to-back diodes in series.

Furthermore, as described in "Rewriteable Memory With Non-Linear Memory Element," U.S. application Ser. No. 10/604,556, filed Jul. 30, 2003, incorporated herein by reference in its entirety for all purposes, it may also be possible for the memory cell exhibit non-linear characteristics without a separate non-ohmic device. It should be noted that since it is possible for a memory cell to exhibit non-linear characteristics the terms "resistive memory" and "resistive device" also apply to memories and devices showing non-linear characteristics, and can also be referred to as "conductive memory" and "conductive device." While a non-ohmic device might be desirable in certain arrays, it may not be helpful in other arrays.

Electrodes will typically be desirable components of the memory plugs 255 or 310, a pair of electrodes sandwiching the multi-resistive state element. If the only purpose of the electrodes is as a barrier to prevent metal inter-diffusion, then a thin layer of metal, e.g. TiN, Pt, Au, Ag and Al. could be used. However, conductive oxide electrodes may provide advantages beyond simply acting as a metal inter-diffusion barrier. Co-pending U.S. patent application, "Conductive Memory Device With Barrier Electrodes," U.S. application Ser. No. 10/682,277, filed Oct. 8, 2003, incorporated herein by reference in its entirety for all purposes, describes electrodes (formed either with a single layer or multiple layers) that prevent the diffusion of metals, oxygen, hydrogen and water, act as a seed layer in order to form a good lattice match with the conductive memory element, include adhesion layers, and reduce stress caused by uneven coefficients of thermal expansion, and provide other benefits. Additionally, the choice of electrode layers in combination with the multi-resistive state element layer may affect the properties of the memory plug 255 or 310, as is described in co-pending U.S. patent application, "Resistive Memory Device With A Treated Interface," U.S. application Ser. No. 10/665,882, filed Sep. 19, 2003, incorporated herein by reference in its entirety for all purposes. The multi-resistive state element will generally, but not necessarily, be crystalline, either as a single crystalline structure or a polycrystalline structure. One class of multi-resistive state element are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr), other materials such as $Ca_2Nb_2O_7$:Cr, and $Ta_2O_5$:Cr, and high Tc super-conductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state element for use in the memory plug 255 or 310. The compounds that make up the perovskite class of multi-resistive state elements include both simple conductive metal oxides and complex conductive metal oxides. Further, some oxides that may not be conductive in their pure form may be used as they become conductive through the addition of dopants, or if they are used as a very thin layer (e.g., in the order of tens of Angstroms) in which case tunneling conduction can be achieved. Therefore, as will be appreciated by those skilled in the art, the terms "conductive memory" and "conductive device" can include devices that are fabricated with materials that are classified as insulators, but are thin enough to allow tunneling conduction. Multi-resistive state elements, however, are not limited to perovskites. Specifically, any material that has a hysteresis that exhibits a resistive state change upon application of a voltage while allowing non-destructive reads is a good candidate for a multi-resistive state element. A non-destructive read means that the read operation has no effect on the resistive state of the memory element. Measuring the resistance of a memory cell is accomplished by detecting either current after the memory cell is held to a known voltage, or voltage after a known current flows through the memory cell. Therefore, a multi-resistive state material that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. The same principle applies if more that one resistive state is used to store information (e.g., the multi-resistive state element has a high resistive state of $R_{00}$, a medium-high resistive state of $R_{01}$, a medium-low resistive state of $R_{10}$ and a low resistive state of $R_{11}$).

As described in co-pending U.S. patent application, "A 2-Terminal Trapped Charge Memory device with Voltage Switchable Multi-Level Resistance," U.S. application Ser. No. 10/634,636, filed Aug. 4, 2003, incorporated herein by reference in its entirety for all purposes, trapped charges are one mechanism by which the hysteresis effect is created. Trapped charges can be encouraged with dopants, as described in co-pending U.S. patent application, "Multi-Resistive State Material that Uses Dopants," U.S. application Ser. No. 10/604,606, filed Aug. 4, 2003, incorporated herein by reference in its entirety for all purposes.

It should be appreciated that fabrication of the multi-resistive state element might include additional techniques in order to ensure an effective memory device. For example, biasing the multi-resistive state element might be required in order to ensure the hysteresis is presented in a certain direction. Co-pending U.S. patent application, "Multi-Layer Conductive Memory Device," U.S. application Ser. No. 10/605,757, filed Oct. 23, 2003, incorporated herein by reference in its entirety for all purposes describes using a multi-layered multi-resistive state element in order to encourage a hysteresis in a certain direction.

The fabrication techniques used for the memory plug 255 or 310 will typically dictate the requirements of the layers beneath the memory plug (e.g., in a transistor memory array the select line 320; and in a cross point array 100 or 150 the driver circuitry and conductive lines 105, 175, 180, 190 and 195).

Since certain fabrication processes (e.g., solution based spin on followed by high temperature anneal, pulsed laser deposition, sputtering, and metal-organic chemical vapor deposition) might require high temperatures, refractory metals should be used for these layers so that they may withstand the temperatures. However, refractory metals have higher resistances, which may limit the number of cells on an array. Co-pending U.S. patent applications, "Laser Annealing of Complex Metal Oxides (CMO) Memory Materials for Non-Volatile Memory Integrated Circuits," U.S. application Ser. No. 10/387,799, and "Low Temperature Deposition of Complex Metal Oxides (CMO) Memory Materials for Non-Volatile Memory Integrated Circuits," U.S. application Ser. No. 10/387,799, both filed Mar. 13, 2003, and both incorporated herein by reference in their entireties for all purposes, describe fabrication techniques that may be able to be used in lieu of high temperature fabrication processes.

Methods of Manufacture

Figure 4:
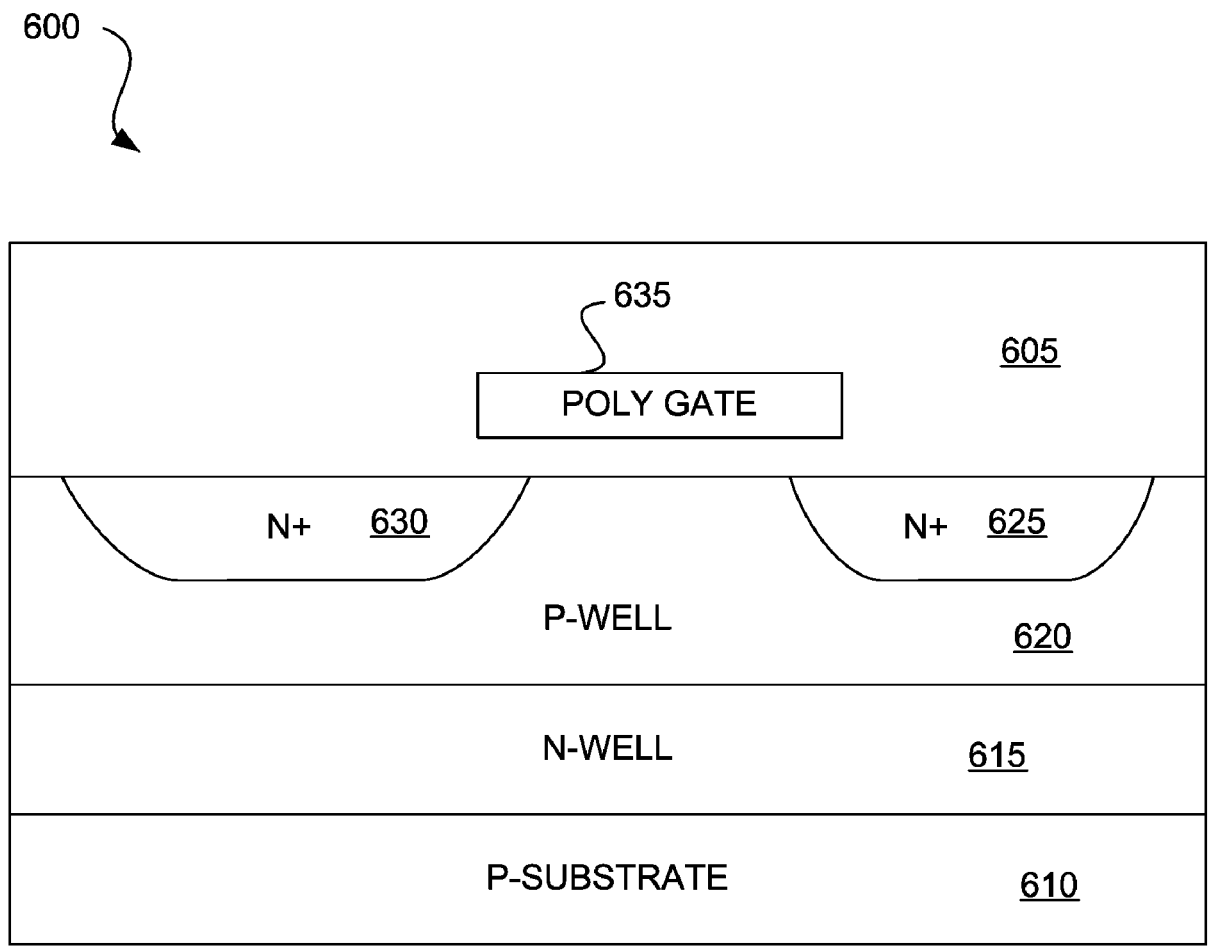
FIG. 4 depicts a cross sectional view of a partially processed integrated circuit up to the completion of a bottom front end of line section.

FIG. 4 depicts a cross sectional view of a partially processed integrated circuit up to the completion of a bottom front end of line (FEOL) processed section 600. A p-type substrate 610 lies beneath an n-well 615 that in turn lies underneath a p-well 620. Two N+ lands 625 and 630 are created within the p-well 620 to form reverse-biased p-n junctions. A first inter-layer dielectric (ILD) 605 is formed atop the p-well 620. A select line 635 can be formed, within the first ILD 605, with a standard polysilicon gate controllably turning on a field effect transistor (FET) type of conduction between the two N+ lands 625 and 630. For simplicity and low cost fabrication, the selected FEOL process can be any of the many standard IC processes such as Silicon, Germanium, Gallium Arsenide, Silicon-Germanium and Silicon on Insulator. FEOL processes are generally defined as operations performed on a semiconductor wafer in the course of device manufacturing up to but just before first metallization, and might end with chemical-mechanical polishing (CMP) of the first ILD 605. To simplify the description of the present invention, the following embodiments are generally described using a Silicon process with the understanding that the scope of our present invention is not so limited.

Figure 5:
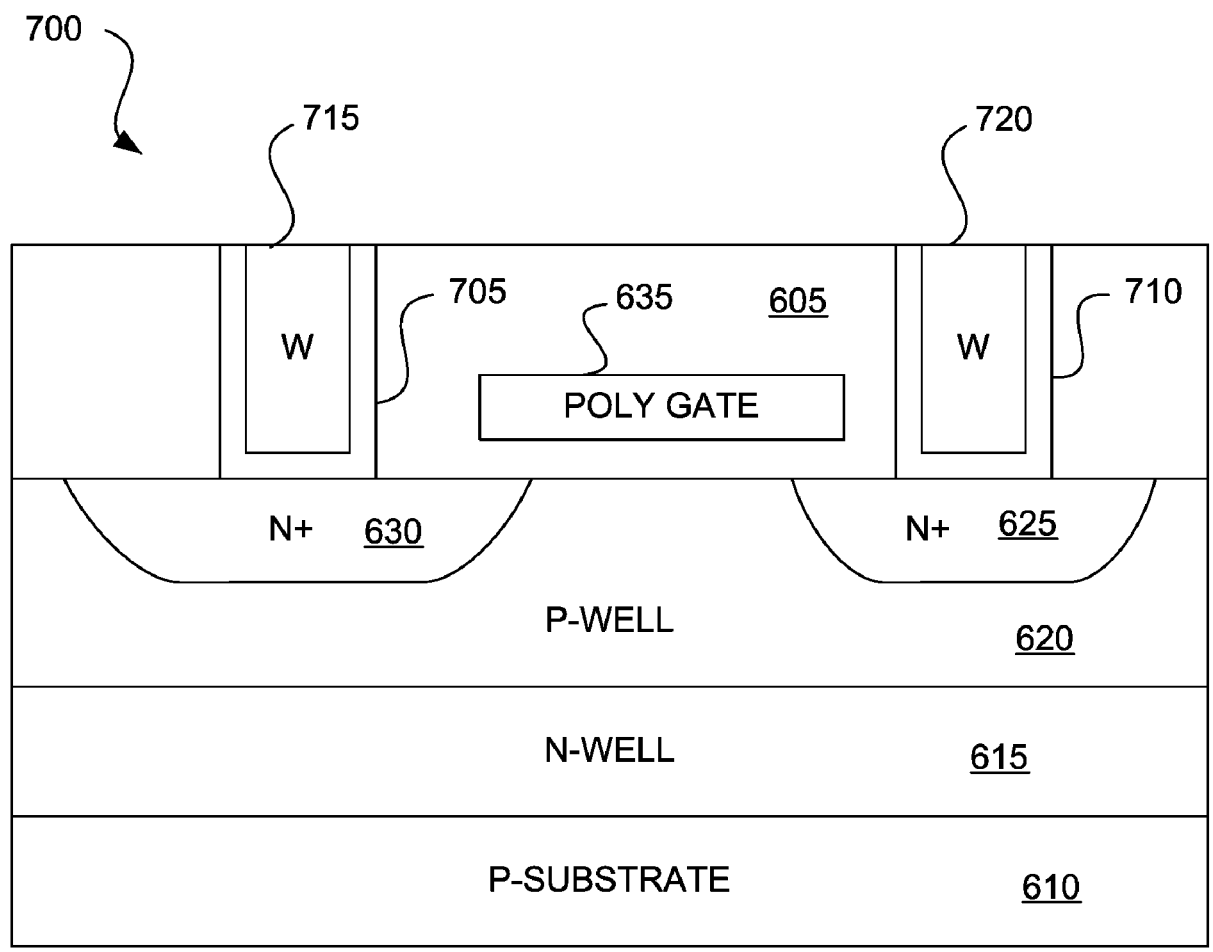
FIG. 5 depicts a cross sectional view of a further processed integrated circuit from FIG. 4 after the formation of a plurality of conductive plugs.

FIG. 5 depicts a cross sectional view of a further processed integrated circuit 700 after conductive plugs are formed in the FEOL section 600 of FIG. 4. In the process that is shown, a number of contact holes, each corresponding to the location of a desired conductive plug, are first formed through the first ILD 605. Barrier/adhesion layers 705 and 710 can then sputtered inside the contact holes. Notice that sputtering is a form of physical vapor deposition technique. The specific sputtering composition will depend on the conductive plug material being used, and can be 100 Å Ti followed by 200 Å of TiN. Next, a conductive plug material can be deposited within the contact holes atop the barrier/adhesion layers 705 and 710. As illustrated, the conductive plug can be Tungsten (W)-plug 715 and Tungsten (W)-plug 720 deposited with 5000 Å of W using chemical vapor deposition (CVD) followed by an etchback process or chemical-mechanical polishing (CMP) to remove excess conductive plug material atop the first ILD 605 surface.

Figure 6:
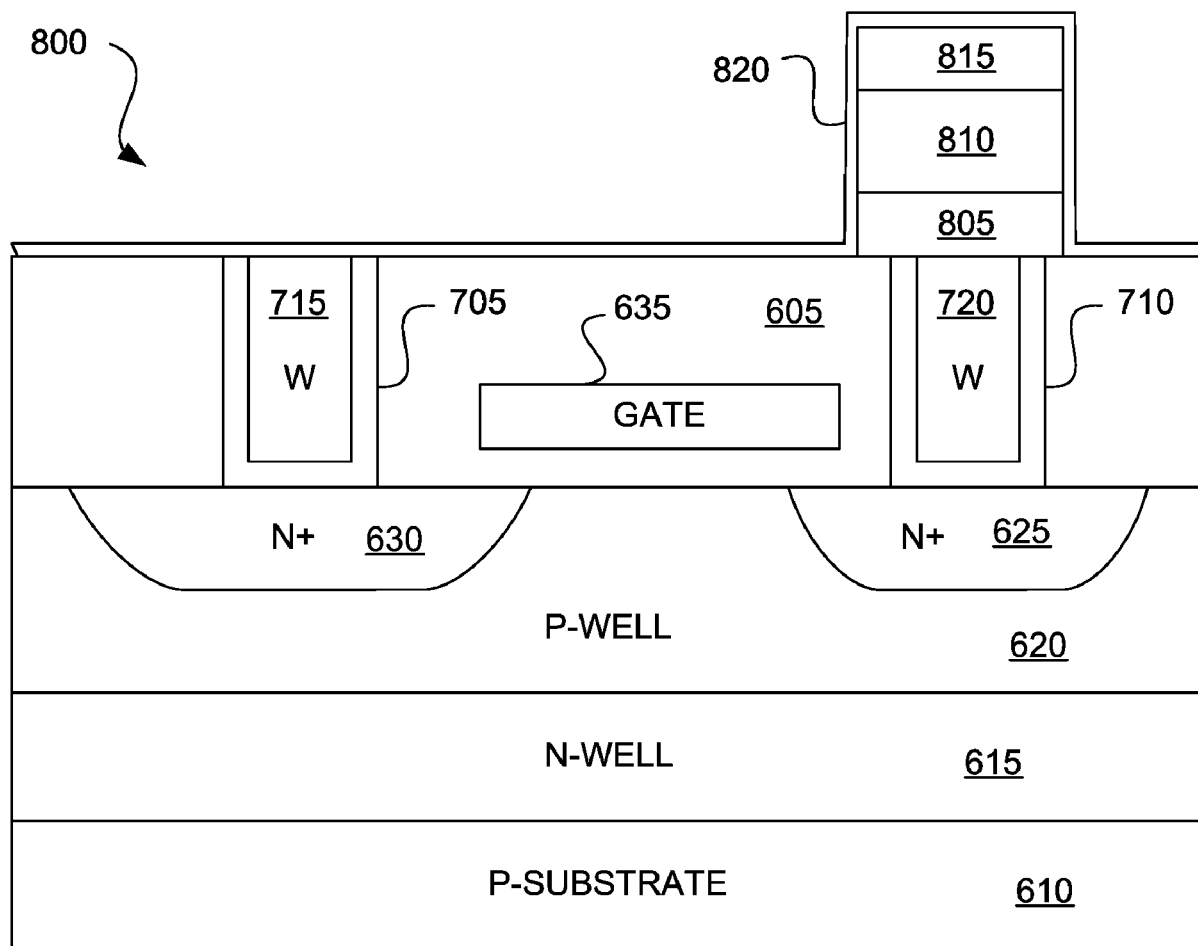
FIG. 6 depicts a cross sectional view of a further processed integrated circuit from FIG. 5 after the partial formation of a middle memory plug section atop the front end of line section.

FIG. 6 depicts a cross sectional view of a further processed integrated circuit 800 after the partial formation of a middle memory plug section atop the partially processed integrated circuit 700 from FIG. 5. First, a bottom electrode 805 is deposited. The bottom electrode 805 can in turn be made of multiple layers, such as a 500 Å thick barrier layer of TiAlN to prevent metal inter-diffusion followed by a 500 Å LaNiO$_3$ or 1000 Å Pt. These layers can be deposited by sputtering. Next, a multi-resistive state element 810 is deposited on top of the bottom electrode 805. The multi-resistive state element 810 is typically made of a conductive metal oxide and can be 2000 Å of a material having a stoichiometry of Pr$_{0.7}$Ca$_{0.3}$MnO$_3$ (PCMO) and is preferably deposited at less than or equal to about 600° C. by a physical vapor deposition technique such as sputtering, followed by annealing. The annealing step helps to recover the intended crystalline structure and material composition of the multi-resistive state element 810. Next, a top electrode 815 that can have a composition similar to the bottom electrode 805 can be deposited using sputtering. Standard photolithography and appropriate multi-step etch processes can then be used to pattern the bottom electrode/multi-resistive state element/top electrode layers into a memory plug. As an optional improvement, one or both of the bottom electrode 805 and the top electrode 815 can be made of a conductive layer and a barrier layer to prevent metal inter-diffusion. See copending application entitled "Conductive Memory Device With Barrier Electrodes," filed Oct. 8, 2003, Ser. No. 10/682, 277, already incorporated herein by reference, for further details.

Numerous sputtering techniques can be employed to further improve the formation of the middle memory plug section. In an off-axis sputtering process, the target surface, the supplier of the material to be sputtered, and the substrate surface, the receiver of the material to be sputtered, are oriented approximately orthogonal to each other, about 70 to 90 degrees. The advantage of the off-axis sputtering includes minimizing material damage from ion impingement during an on-axis reactive ion sputtering process. In a co-sputtering process, the deposited materials are sputtered from more than one target concurrently so as to create a plasma of more than one material, hence the deposition of more than one material on the substrate surface at the same time. Thus, the advantage of co-sputtering includes flexibility of material composition. In a continuous deposition process, in-situ multi-layer film deposition takes place inside the same deposition chamber without breaking the vacuum. This deposition technique is most easily accomplished, for example, in a sputtering machine by keeping the substrate at one location while switching targets or by switching deposition chambers within one system. By not breaking the vacuum, numerous contamination and oxidation problems from exposure to air are avoided.

Given the above discussion, the deposition of the multi-resistive state element 810 can advantageously employ the co-sputtering technique. At least one of the three sputtering processes for the bottom electrode 805, the multi-resistive state element 810 and the top electrode 815 can employ the off-axis sputtering technique. Furthermore, out of these three sputtering processes, at least two consecutive sputtering processes can advantageously use the continuous deposition technique. As another option, an etch stop/diffusion barrier 820 might then be deposited to protect the PCMO from inter-diffusion. The etch stop/diffusion barrier 820 would surround the exposed surfaces of the bottom electrode 805, top electrode 815 and multi-resistive state element 810 as shown. Notice that the etch stop/diffusion barrier 820 is a dual-function layer also acting as an etch stop in the fabrication process. Notice also that the etch stop/diffusion barrier 820 forms a sidewall layer that surrounds the side surfaces of the bottom electrode 805, the multi-resistive state element 810 and the top electrode 815. The etch stop/diffusion barrier 820 can be made of 250 Å of $Si_3N_4$, $TiO_2$ or $Al_2O_3$. As a material improvement, the deposition of the multi-resistive state element 810 can be followed by modification of the interface property between the multi-resistive state element 810 and the later deposited top electrode 815. More specifically, the modification of the interface property can be done by ion implantation, in situ plasma treatment in various gasses, or in situ annealing in various gasses. Possible gasses might include argon, oxygen or hydrogen.

Figure 7:
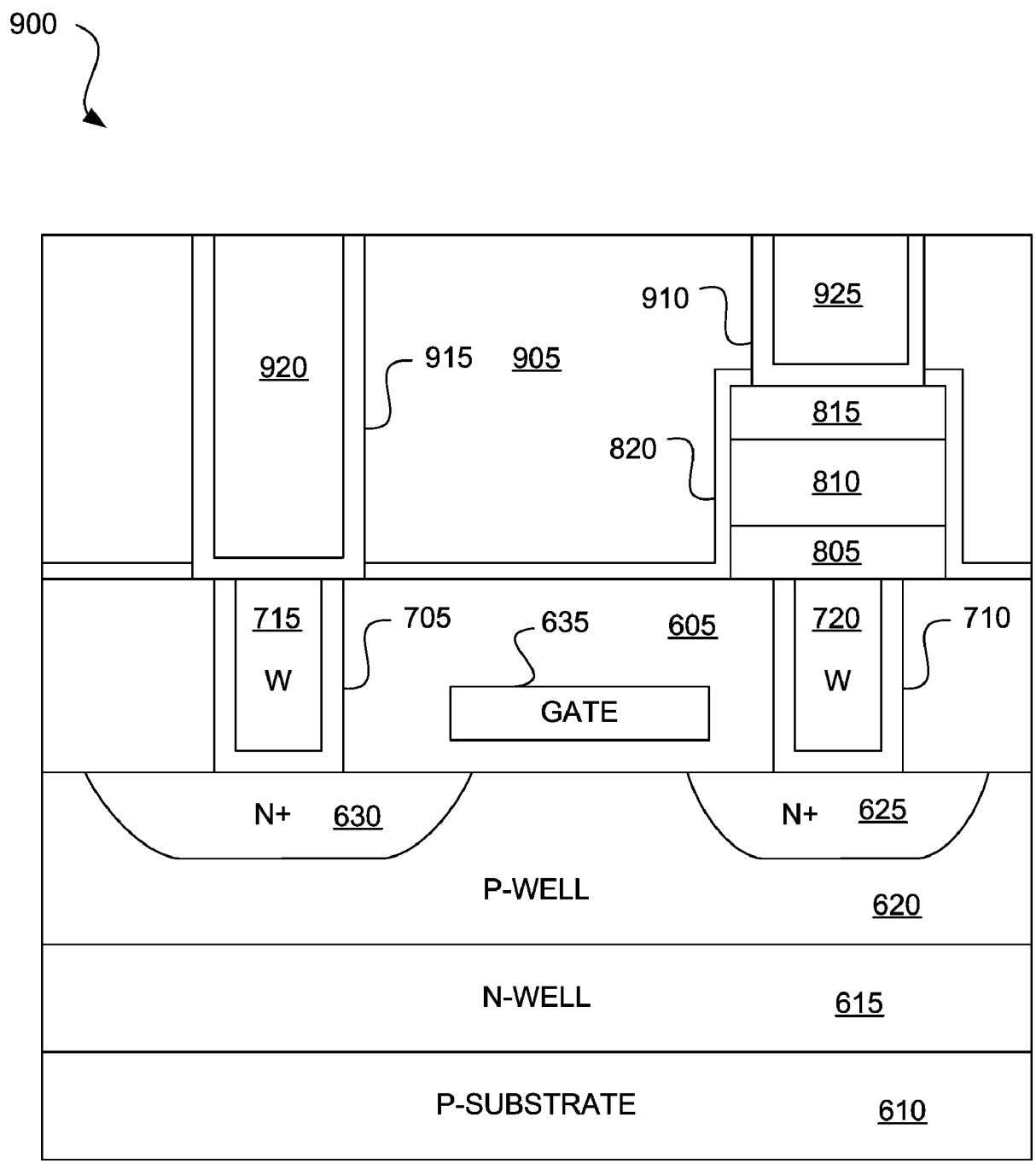
FIG. 7 depicts a cross sectional view of a further processed integrated circuit from FIG. 6 after the complete formation of a middle memory plug section atop the front end of line section.

FIG. 7 depicts a cross sectional view of a further processed integrated circuit 900 after the complete formation of a middle memory plug section atop the partially processed integrated circuit 800 of FIG. 6. As a clarification while counting IC components upwards from the bottom, the middle memory plug section includes all IC components above the top surface of the first ILD 605, as shown in FIG. 5, up to the top surface of a second ILD 905.

The second ILD 905 is deposited on top of the etch stop/diffusion barrier 820. The second ILD 905 can be made of a thick $SiO_2$ layer and then planarized by chemical-mechanical polishing (CMP). A plurality of via holes, locationally and geometrically corresponding to the top electrode 815, can then be formed with standard photolithography and via etch. Barrier/adhesion layers 910 and 915 are then sputtered inside the via holes. The specific sputtering composition can be 100 Å Ti followed by 200 Å of TiN. Next, a conductive plug material is deposited within the contact holes atop the barrier/adhesion layers 910 and 915. The conductive plug can be W-plug 920 and W-plug 925 deposited with 5000 Å of W using chemical vapor deposition (CVD) followed by an etchback process or CMP to remove excess conductive plug material atop the second ILD 905 surface. As a process improvement, an annealing step can take place at this point to help in recovering the original crystalline structure and material composition of the middle memory plug section.

Figure 8:
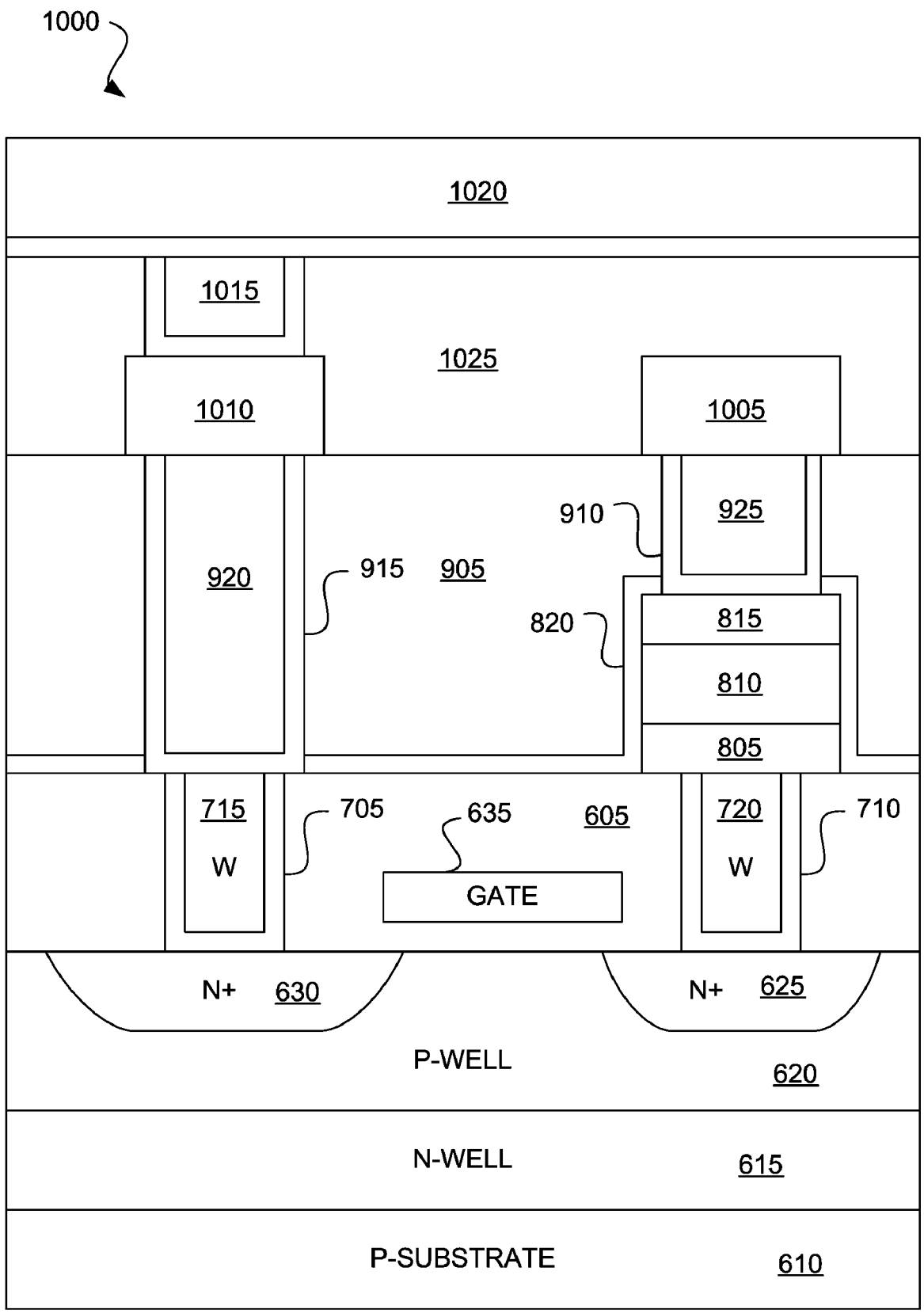
FIG. 8 depicts a cross sectional view of a completely processed integrated circuit from FIG. 7 after the complete formation of a top metallization section atop the middle memory plug section.

FIG. 8 depicts a cross sectional view of a completely processed integrated circuit 1000 from FIG. 7 after the complete formation of a top metallization section atop the middle memory plug section. As a clarification while counting IC components upwards from the bottom, the top metallization section includes all IC components above the middle memory plug section. Using standard processes, one or more metallization layers can be formed above the partially processed integrated circuit 900 of FIG. 7. Two metallization layers are illustrated in this embodiment. The first metallization layer can be used to form both a reference line 1005 and a metal plug 1010 that eventually connects two W-plugs 920 and 1015. The W-plug 1015 is used to connect a data line 1020, formed during the second metallization layer, to the metal plug 1010 through a third ILD 1025 used to support the data line 1020. The W-plug 1015 and the third ILD 1025 are respectively formed with processes similar to those described before. As a process improvement, an annealing step can take place at this point to help recovering the original crystalline structure and material composition of the completed IC. By now it should become clear to those skilled in the art, while the bottom front end of line section 600 is shown with the addition of a FET with a terminal of N+ land 625 connected to the bottom electrode 805 of the conductive memory device via the W-plug 720, in general any other IC components can be implemented instead to connect the bottom electrode 805 to suit a corresponding application. Some examples are a resistor, a capacitor or a non-ohmic device like a diode. To further clarify the spatial orientation and alignment of the conductive memory device an X-Y-Z Cartesian coordinate system can be set in reference to FIG. 8: the interfaces between the electrodes 805 and 815 and the multi-resistive state element 810 generally define the X-Y plane while the direction of current through the conductive memory device is essentially parallel to the Z-axis.

Figure 9:
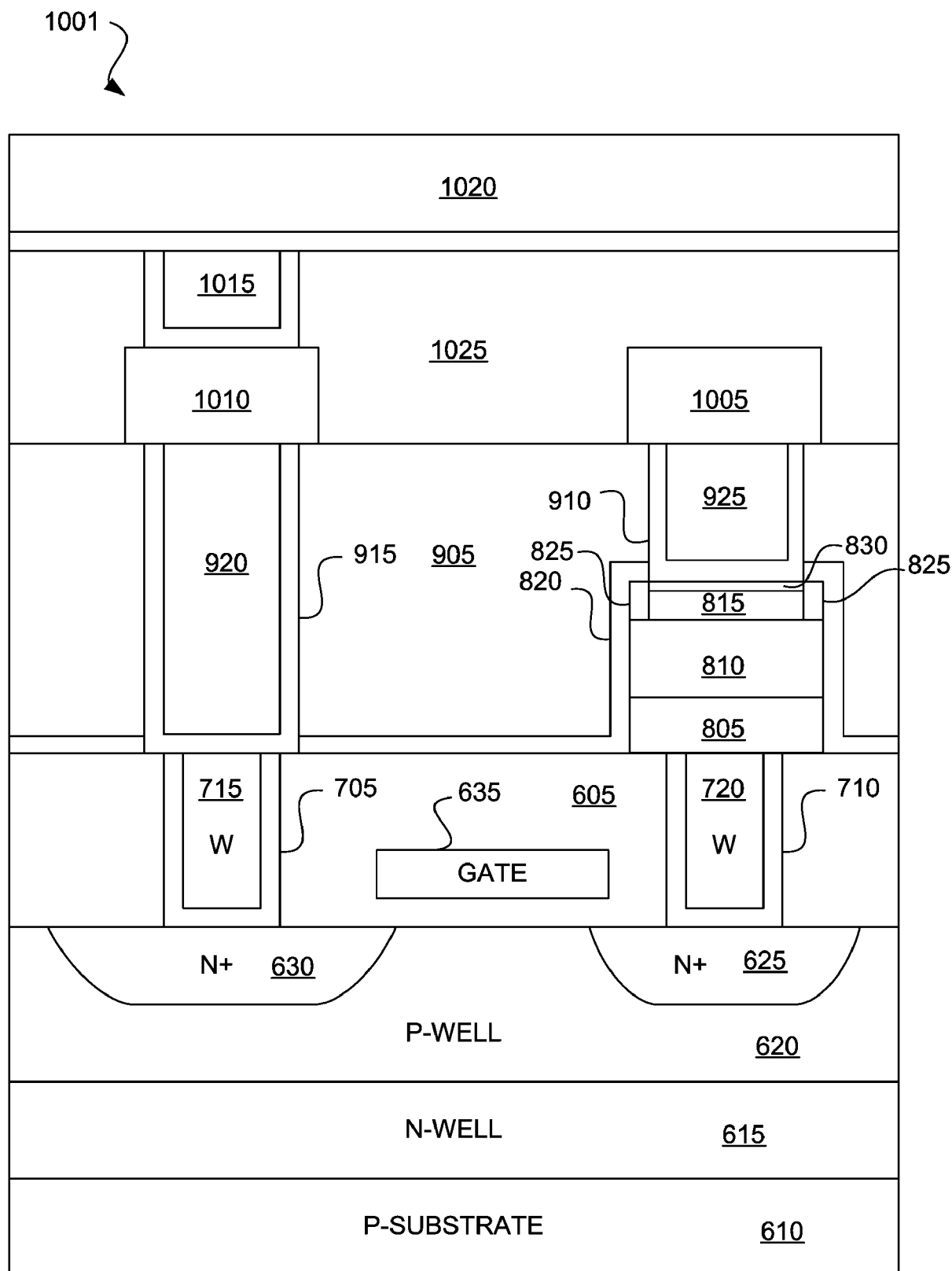
FIG. 9 depicts a cross sectional view of a completely processed integrated circuit wherein the conductive memory devices of the middle memory plug section further include features of a hard mask layer and a spacer.

FIG. 9 depicts a cross sectional view of another completely processed integrated circuit 1001 wherein the conductive memory devices of the middle memory plug section further include features of a hard mask 830 layer and a spacer 825. Except for these features, whose fabrication process is to be presently described, the completely processed integrated circuit 1001 is otherwise the same as the completely processed integrated circuit 1000 depicted in FIG. 8. The spacer 825 can be made of a dielectric material surrounding the top electrode 815. Some examples of the dielectric material are $Si_3N_4$, $SiO_2$, $TiO_2$, SiON or $Al_2O_3$. The hard mask 830 is typically made of an electrically conductive material having a similar X-Y cross section as the top electrode 815. The hard mask 830 is a masking material that is used as etching mask to protect the film or films underneath from etching in a plasma etch chamber. The hard mask materials can be divided into two categories, insulator or conductor. The popular insulating hard mask materials are oxide and nitride. The popular conductive hard mask materials are binary nitrided metals including TiN, TaN, WN, etc. and ternary nitrided metals including TiSiN, TiAlN, TaSiN, etc. One advantage of the hard mask over a standard photo-resist is that the hard mask can resist a dry etching process requiring elevated temperature. Usually reactive ion etching (RIE) at an elevated temperature is required to etch precious metals or complex metal oxides because of the difficulties associated with their etching, especially the etch byproduct volatility. Due to the impact of previous etch steps defining the profile of bottom electrode 805, multi-resistive state element 810 and top electrode 815, the outer periphery of the multi-resistive state element 810 is often damaged by plasma ions, causing a corresponding leakage current conduction in the Z-direction. This leakage current can short out the current conduction through the bulk of the multi-resistive state element 810, and is therefore undesirable and detrimental to the operation of the conductive memory device. The introduction of the spacer 825 makes the cross sectional area, along the X-Y plane, of the top electrode 815 smaller than that of the multi-resistive state element 810. The spacer 825 creates a resistance between the sides of the electrode 815 and the edge of the multi-resistive state element 810. Hence, the X-Y footprint of the spacer 825 can be made large enough to make the resistance between the sides of the top electrode 815 and the edge of the multi-resistive state element 810 high enough to render the effect of the leakage current conduction negligible.

Figure 10A:
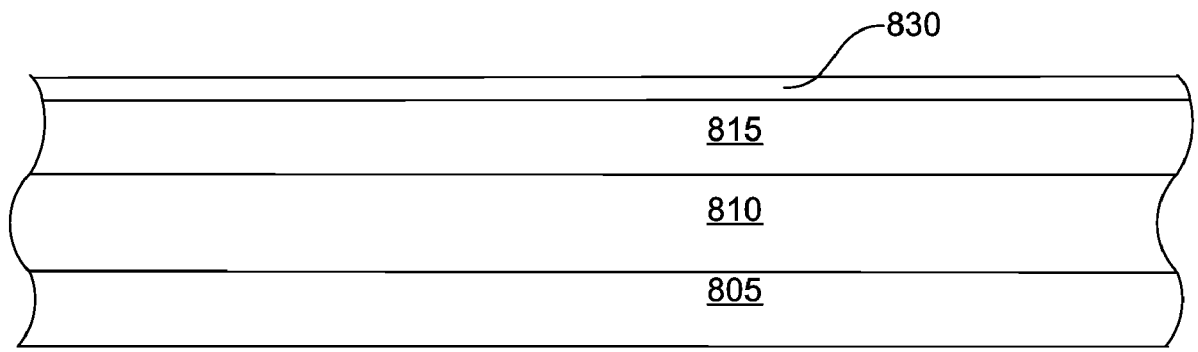
FIG. 10A through FIG. 10E detail an exemplary sequence of various processing steps that could be used for the creation of the hard mask and spacer features of the conductive memory devices of FIG. 9.
Figure 10B:
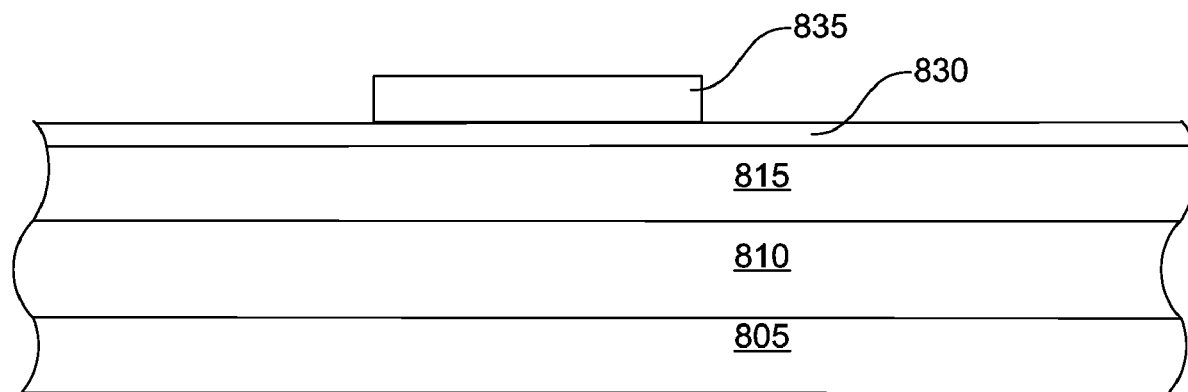
Figure 10C:
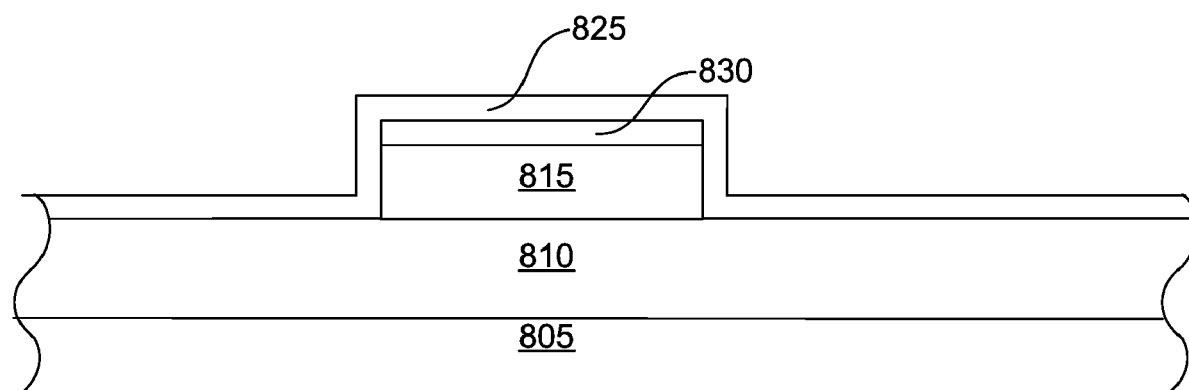
Figure 10D:
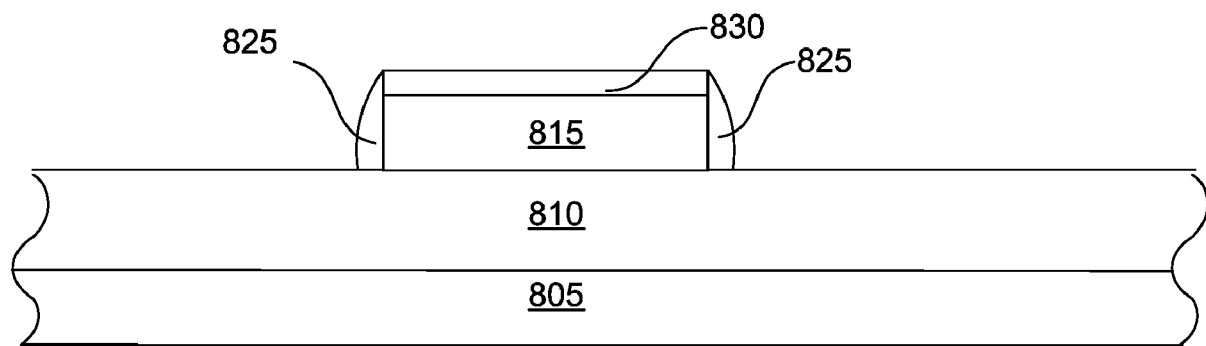
Figure 10E:
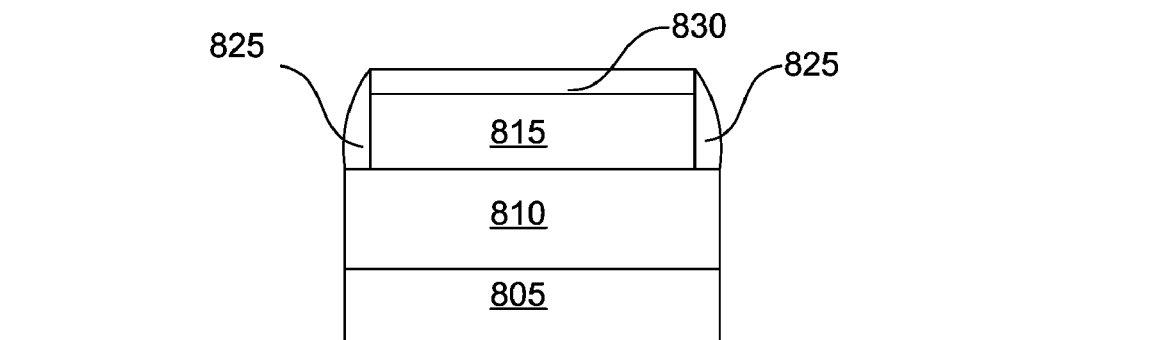

FIG. 10A through FIG. 10E detail an exemplary sequence of various processing steps that could be used for the creation of the hard mask 830 and spacer 825 features of the conductive memory device 1001 of FIG. 9. FIG. 10A illustrates only a conductive memory device following the steps of sputtering a bottom electrode layer 805, sputtering a multi-resistive state element layer 810, sputtering a top electrode layer 815 and depositing a hard mask layer 830. The hard mask layer can be deposited by various means such as Chemical Vapor Deposition, spin coat or sputtering. Like before, the deposition of the multi-resistive state element 810 can be followed by modification of the interface property between the multi-resistive state element 810 and the later deposited top electrode 815. More specifically, the modification of the interface property can be done by ion implantation, in situ argon plasma treatment, in situ oxygen plasma treatment, in situ annealing in argon or in situ annealing in oxygen. FIG. 10B and FIG. 10C illustrate the steps of photo lithographically etching, with a photo resist 835, the hard mask layer 830 and the top electrode layer 815 both having cross sections smaller than that of a later-patterned multi-resistive state element 810. A dielectric material is then deposited on top to form the spacer 825. FIG. 10D illustrates the conductive memory device following an anisotropic dry etching, with a much higher etch rate in the Z-direction than the X- and Y-directions, of the dielectric material to create a sidewall spacer 825 surrounding the side surfaces of the top electrode 815 and the hard mask 830. Finally, FIG. 10E illustrates the conductive memory device following an etching of the multi-resistive state element layer 810 and the bottom electrode layer 805. As an optional measure to further remove the damaged outer periphery of the multi-resistive state element 810, an additional clean-up step of wet etching can be applied to selectively remove 50–150 Å material of the multi-resistive state element sides, thus forming an undercut.

Figure 11:
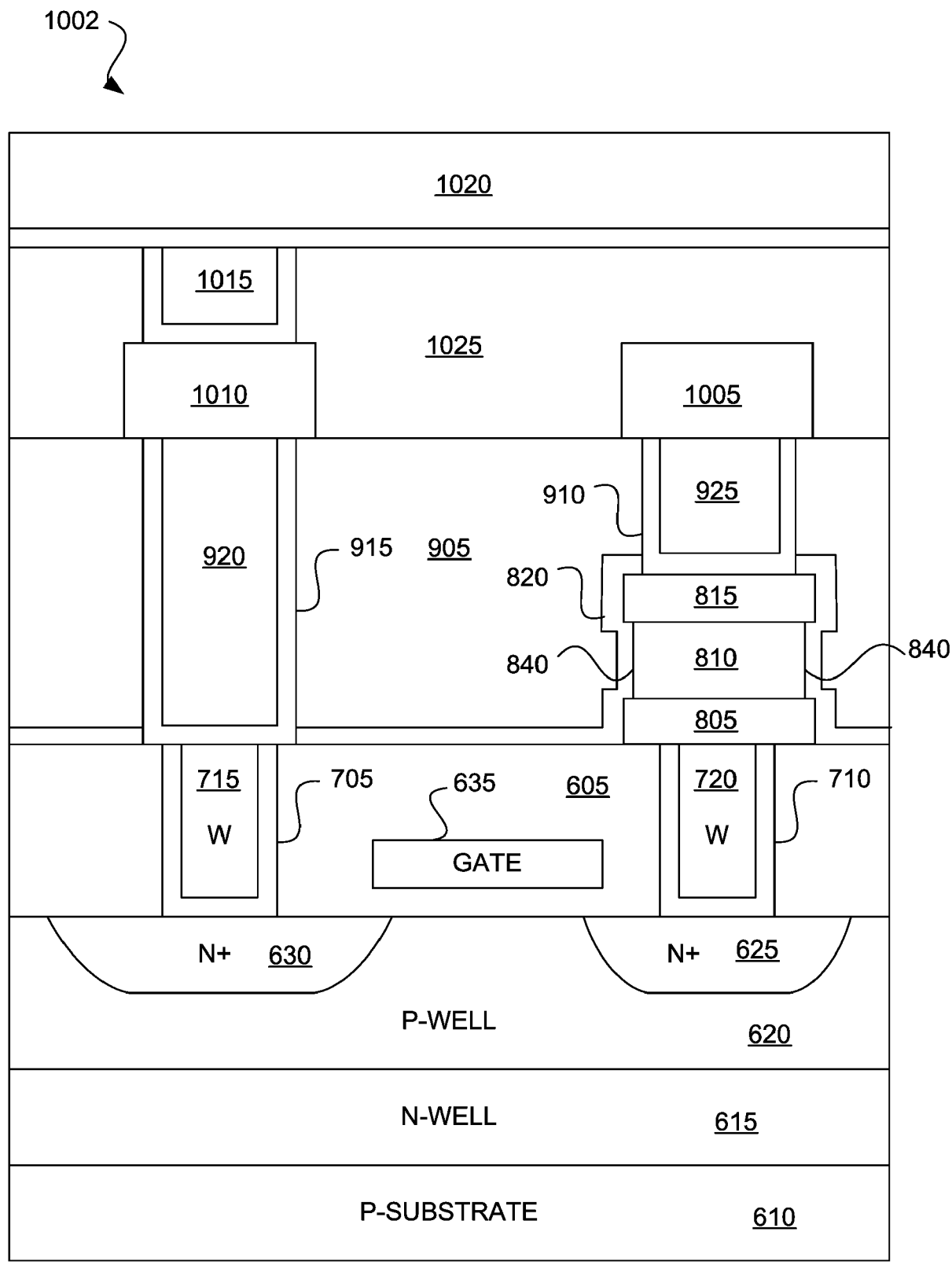
FIG. 11 depicts a cross sectional view of a completely processed integrated circuit wherein the conductive memory devices of the middle memory plug section further include an optional undercut feature.

FIG. 11 depicts a cross sectional view of yet another completely processed integrated circuit 1002 wherein the conductive memory devices of the middle memory plug section include an undercut 840. Geometrically, the X-Y cross section of the bottom electrode 805 is larger than that of the multi-resistive state element 810. Similarly, the X-Y cross section of the top electrode 815 is also larger than that of the multi-resistive state element 810. Except for the undercut 840 the completely processed integrated circuit 1002 is otherwise the same as the completely processed integrated circuit 1000 depicted in FIG. 8. Referring back to FIG. 6 and its accompanying description, after patterning the bottom electrode/multi-resistive state element/top electrode layers into a memory plug an optional clean-up step of wet etching can be applied to selectively remove 50–150 Å of the sides of the multi-resistive state element 810, thus forming an undercut 840 as shown in FIG. 11. The purpose of the undercut 840 is to directly remove the damaged outer periphery of the multi-resistive state element 810 that would otherwise cause an undesirable leakage current conduction in the Z-direction, as explained before.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. For example, each conductive plug might have a bottom surface area that is larger than the contact hole's top surface area such that each conductive plug has an overhang that is not in contact with the contact hole's top surface area. In such a case, a barrier layer that is in contact with the plug's overhang could be an advantageous improvement. Additionally, peripheral circuitry, such as that described in Co-pending U.S. patent application, "An Adaptive Programming Technique for a Re-Writeable Conductive Memory Device," U.S. application Ser. No. 10/680,508, filed Oct. 6, 2003, incorporated herein by reference in its entirety for all purposes, can be easily implemented in the system. Accordingly, that which is intended to be protected by Letters Patent is set forth in the claims and includes all variations and modifications that fall within the spirit and scope of the claim.

What is claimed is:

1. A conductive memory device comprising:
   a bottom electrode having a top face with a first surface area;
   a top electrode located above the bottom electrode having a bottom face with a second surface area; and
   a multi-resistive state element, wherein a read operation is non-destructive to a resistive state of the multi-resistive state element the multi-resistive state element is sandwiched between the bottom electrode and the top electrode and having a bottom face with a third surface area and a top face with a fourth surface area, the multi-resistive state element's bottom face being in contact with the bottom electrode's top face, and the multi-resistive state element's top face being in contact with the top electrode's bottom face;
   wherein the fourth surface area is not equal to the second surface area.

2. The conductive memory device of claim 1 further comprising:
   a diffusion barrier;
   wherein the bottom electrode, the top electrode and the multi-resistive state element each have sides that are adjacent to their faces, the sides being covered by the diffusion barrier.

3. The conductive memory device of claim 2 wherein the diffusion barrier is also an etch stop.

4. The conductive memory device of claim 2 wherein the diffusion barrier is $Si_3N_4$, $TiO_2$ or $Al_2O_3$.

5. The conductive memory device of claim 1 wherein the first surface area is larger than the third surface area.

6. The conductive memory device of claim 1 wherein the second surface area is larger than the fourth surface area.

7. The conductive memory device of claim 1 further comprising
a sidewall layer
wherein the bottom electrode, the top electrode and the multi-resistive state element each have sides that are adjacent to their faces, the sides being at least partially covered by the sidewall layer.

8. The conductive memory device of claim 1 wherein the second surface area is smaller than the fourth surface area.

9. The conductive memory device of claim 8 further comprising:
a hard mask layer having a bottom face with a surface area substantially similar to the second surface area;
wherein the top electrode has a top face that is in contact with the bottom face of the hard mask layer.

10. The conductive memory device of claim 8 further comprising:
a spacer;
wherein the top electrode has sides adjacent to its bottom face, the spacer surrounding the sides.

11. The resistive memory device of claim 10 wherein the spacer has a bottom face that is in contact with the top face of the multi-resistive state element such that the spacer's width makes up for the cross sectional difference between the top electrode's bottom face and the multi-resistive state element's top face, thereby ensuring complete coverage of the multi-resistive state element's top face.

12. The conductive memory device of claim 10 wherein the spacer is a dielectric material.

13. The conductive memory device of claim 12 wherein:
the multi-resistive state element has sides that are adjacent to its faces; and
the spacer's width is large enough to make the detrimental effect of any leakage current conduction between the top electrode and the bottom electrode near the sides of the multi-resistive state element negligible.

14. The conductive memory device of claim 12 wherein the dielectric material is $Si_3N_4$, $SiO_2$, $TiO_2$, SiON or $Al_2O_3$.

15. The conductive memory device of claim 10 further comprising:
a sidewall layer operable as a dual-function etch stop layer and a diffusion layer;
wherein the bottom electrode, the top electrode and the multi-resistive state element each have sides that are adjacent to their faces, the sides being at least partially covered by the sidewall layer.

16. The conductive memory device of claim 1 wherein, expressed in an X-Y-Z Cartesian coordinate system:
the top and bottom faces of the bottom electrode, the top electrode and the multi-resistive state element lie essentially in the X-Y plane; and
the direction of current conduction through the conductive memory device is essentially parallel to the Z-axis.

17. A conductive memory device comprising:
a bottom electrode having a top face with a first surface area;
a top electrode located above the bottom electrode having a bottom face with a second surface area; and
a multi-resistive state element sandwiched between the bottom electrode and the top electrode and having a bottom face with a third surface area and a top face with a fourth surface area, the multi-resistive state element's bottom face being in contact with the bottom electrode's top face, and the multi-resistive state element's top face being in contact with the top electrode's bottom face;
wherein the fourth surface area is less than the second surface area.

18. The conductive memory device of claim 17 wherein the first surface area is larger than the third surface area.

19. The conductive memory device of claim 17 wherein the first surface area is not equal to the third surface area.

20. The conductive memory device of claim 17 wherein a read operation is non-destructive to a resistive state of the multi-resistive state element.

* * * * *